United States Patent
Sobhana (10) Patent No.: US 11,578,586 B2
(45) Date of Patent: Feb. 14, 2023

(54) AZIMUTH ESTIMATION FOR DIRECTIONAL DRILLING

(71) Applicant: Halliburton Energy Services, Inc., Houston, TX (US)

(72) Inventor: Rashobh Rajan Sobhana, Singapore (SG)

(73) Assignee: Halliburton Energy Services, Inc., Houston, TX (US)

( * ) Notice: Subject to any disclaimer, the term of this patent is extended or adjusted under 35 U.S.C. 154(b) by 357 days.

(21) Appl. No.: 16/646,515

(22) PCT Filed: Nov. 29, 2018

(86) PCT No.: PCT/US2018/062983
§ 371 (c)(1),
(2) Date: Mar. 11, 2020

(87) PCT Pub. No.: WO2019/118184
PCT Pub. Date: Jun. 20, 2019

(65) Prior Publication Data
US 2020/0270980 A1 Aug. 27, 2020

Related U.S. Application Data

(60) Provisional application No. 62/598,945, filed on Dec. 14, 2017.

(51) Int. Cl.
*E21B 47/022* (2012.01)
*G01P 15/00* (2006.01)
(Continued)

(52) U.S. Cl.
CPC .......... *E21B 47/022* (2013.01); *G01C 17/02* (2013.01); *G01P 15/00* (2013.01); *G01R 33/02* (2013.01);
(Continued)

(58) Field of Classification Search
CPC ...... E21B 47/02; E21B 47/022; E21B 47/024; E21B 47/0228; E21B 7/04; G01C 17/02;
(Continued)

(56) References Cited

U.S. PATENT DOCUMENTS

| 4,013,945 A | 3/1977 | Grosso |
| 4,813,274 A | 3/1989 | DiPersio et al. |

(Continued)

FOREIGN PATENT DOCUMENTS

| CA | 2312742 C | * 4/2007 | ........... E21B 47/022 |
| CA | 2356025 C | * 11/2007 | ........... E21B 47/022 |

(Continued)

OTHER PUBLICATIONS

ISRWO International Search Report and Written Opinion for PCT/US2018/062983 dated Mar. 19, 2019.

(Continued)

*Primary Examiner* — Patrick Assouad
*Assistant Examiner* — Sean Curtis
(74) *Attorney, Agent, or Firm* — Benjamin Ford; C. Tumey Law Group PLLC (57) ABSTRACT

A method may comprise measuring during a survey operation a gravitational field data using a survey accelerometer and magnetic field data using a survey magnetometer and determining during a drilling operation an azimuth of a wellbore based on the gravitational field data and the magnetic field data obtained during the survey operation. A system may comprise a drilling rig; a pipe string attached to the drilling rig; a bottom hole assembly attached to the pipe string, wherein the bottom hole assembly comprises at least one sensor; a drill bit, wherein the at least one sensor measure a revolutions-per-minute (RPM) of the drill bit; and a computing subsystem.

20 Claims, 6 Drawing Sheets

700 — DURING A SURVEY OPERATION IN A WELLBORE, MEASURE GRAVITATIONAL FIELD DATA USING A SURVEY ACCELEROMETER AND MAGNETIC FIELD DATA USING A SURVEY MAGNETOMETER

702 — DURING A DRILLING OPERATION IN THE WELLBORE, DETERMINE THE AZIMUTH OF THE WELLBORE BASED ON THE GRAVITATIONAL FIELD DATA AND/OR THE MAGNETIC FIELD DATA OBTAINED DURING THE SURVEY (51) Int. Cl.
*G01R 33/02* (2006.01)
*G01V 3/26* (2006.01)
*G01C 17/02* (2006.01)
*G01V 3/38* (2006.01)
*G01V 7/06* (2006.01)
*E21B 7/04* (2006.01)

(52) U.S. Cl.
CPC ............... *G01V 3/26* (2013.01); *G01V 3/38* (2013.01); *G01V 7/06* (2013.01); *E21B 7/04* (2013.01)

(58) Field of Classification Search
CPC ............. G01V 3/26; G01V 3/18; G01V 3/38; G01V 3/083; G01V 7/06; G01P 15/00; G01R 33/02
USPC ............................................. 324/369; 175/45
See application file for complete search history.

(56) References Cited

U.S. PATENT DOCUMENTS

| | | | |
|---|---|---|---|
| 5,452,518 A | 9/1995 | Dipersio | |
| 5,960,370 A * | 9/1999 | Towle | G01V 3/26 |
| | | | 702/7 |
| 6,179,067 B1 * | 1/2001 | Brooks | E21B 47/022 |
| | | | 175/45 |
| 6,470,977 B1 | 10/2002 | Chen et al. | |
| 6,508,316 B2 * | 1/2003 | Estes | G01S 19/53 |
| | | | 175/45 |
| 7,002,484 B2 * | 2/2006 | McElhinney | E21B 47/022 |
| | | | 166/255.2 |
| 7,195,083 B2 | 3/2007 | Eppink et al. | |
| 7,725,263 B2 * | 5/2010 | Sugiura | E21B 47/022 |
| | | | 175/45 |
| 8,085,050 B2 * | 12/2011 | Bittar | G01V 3/28 |
| | | | 324/323 |
| 8,180,571 B2 * | 5/2012 | Holmes | E21B 47/022 |
| | | | 702/9 |
| 9,062,528 B2 | 6/2015 | Mitchell et al. | |
| 9,103,195 B2 | 8/2015 | Gawski et al. | |
| 9,134,452 B2 * | 9/2015 | Bowler | G06F 30/20 |
| 9,932,820 B2 * | 4/2018 | Sugiura | G01C 17/38 |
| 10,466,385 B2 * | 11/2019 | Smidth | G01V 99/005 |
| 10,590,757 B1 | 3/2020 | Miller | E21B 47/12 |
| 10,655,450 B2 * | 5/2020 | Pham | E21B 47/022 |
| 2002/0005298 A1 * | 1/2002 | Estes | G01S 19/53 |
| | | | 73/152.01 |
| 2008/0294343 A1 * | 11/2008 | Sugiura | E21B 47/022 |
| | | | 702/6 |
| 2009/0037110 A1 * | 2/2009 | Holmes | E21B 47/022 |
| | | | 702/10 |
| 2010/0211318 A1 * | 8/2010 | Brooks | G01V 11/00 |
| | | | 702/9 |
| 2011/0196612 A1 | 8/2011 | Bonavides et al. | |
| 2013/0151157 A1 * | 6/2013 | Brooks | E21B 47/022 |
| | | | 702/9 |
| 2014/0163888 A1 * | 6/2014 | Bowler | E21B 47/022 |
| | | | 703/2 |
| 2015/0027779 A1 * | 1/2015 | Sugiura | E21B 47/024 |
| | | | 175/45 |
| 2016/0298392 A1 | 10/2016 | Gajji et al. | |
| 2018/0045850 A1 * | 2/2018 | Smidth | G01V 7/06 |
| 2018/0306944 A1 * | 10/2018 | Ledroz | G01V 11/002 |
| 2018/0363445 A1 * | 12/2018 | Ledroz | G01V 3/26 |
| 2019/0055834 A1 * | 2/2019 | Pham | E21B 49/00 |
| 2020/0270980 A1 * | 8/2020 | Sobhana | G01V 3/26 |
| 2020/0325767 A1 * | 10/2020 | Miller | E21B 7/10 |
| 2021/0254448 A1 * | 8/2021 | Phillips | E21B 47/022 |
| 2022/0120169 A1 * | 4/2022 | Rodney | E21B 7/04 |

FOREIGN PATENT DOCUMENTS

| | | | | |
|---|---|---|---|---|
| CA | 2494144 C | * | 1/2009 | ............ E21B 44/00 |
| CA | 2752618 A1 | * | 8/2010 | ............ E21B 47/02 |
| CA | 3031043 A1 | * | 2/2018 | ............ E21B 47/022 |
| CN | 108603405 A | * | 9/2018 | ............ E21B 47/022 |
| EP | 0654686 B1 | * | 7/2002 | ............ G01V 3/26 |
| GB | 2317454 A | * | 3/1998 | ............ E21B 47/022 |
| GB | 2415446 A | * | 12/2005 | ............ E21B 47/022 |
| GB | 2581671 A | * | 8/2020 | ............ E21B 47/02 |
| GB | 2587443 A | * | 3/2021 | ............ E21B 19/00 |
| WO | WO-0250400 A2 | * | 6/2002 | ............ E21B 47/022 |
| WO | WO-2005124102 A1 | * | 12/2005 | ............ E21B 47/022 |
| WO | WO-2014098838 A1 | * | 6/2014 | ............ G01V 3/08 |
| WO | WO-2015013523 A1 | * | 1/2015 | ............ E21B 47/024 |
| WO | WO-2018031998 A2 | * | 2/2018 | ............ E21B 47/022 |
| WO | WO-2018183326 A1 | * | 10/2018 | ............ E21B 47/022 |
| WO | WO-2018231969 A1 | * | 12/2018 | ............ E21B 47/00 |
| WO | WO-2019006411 A | * | 1/2019 | ....... E21B 47/02216 |
| WO | WO-2019006411 A1 | * | 1/2019 | ....... E21B 47/02216 |
| WO | WO-2019118184 A1 | * | 6/2019 | ............ E21B 47/02 |
| WO | WO-2019240971 A | * | 12/2019 | ............ E21B 44/02 |
| WO | WO-2019240971 A1 | * | 12/2019 | ............ E21B 44/02 |

OTHER PUBLICATIONS

Sugiura, J., Bowler, A., & Lowdon, R. (2014). Improved Continuous Azimuth and Inclination Measurement by Use of a Rotary-Steerable System Enhances Downhole-Steering Automation and Kickoff Capabilities Near Vertical. SPE Drilling & Completion, 29(02), 226-235.

* cited by examiner

AZIMUTH ESTIMATION FOR DIRECTIONAL DRILLING

TECHNICAL FIELD

The present description relates in general to azimuth estimation in the presence of magnetic field interferences, and more particularly to, for example, without limitation, azimuth estimation for directional drilling.

BACKGROUND

Magnetic measurements obtained during wellbore drilling may be affected by external interferences such as from ferromagnetic interferences from drill string, ore deposits in a bottom-hole assembly (BHA), and interaction of drilling fluids and debris with the earth's magnetic field.

The description provided in the background section should not be assumed to be prior art merely because it is mentioned in or associated with the background section. The background section may include information that describes one or more aspects of the subject technology.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

In directional drilling, inertial and position sensors are vital components for the service to be effective. A combination of gravity, magnetic field and, sometimes, angular sensors are used to obtain the location and direction of a wellbore. While gravity sensors or accelerometers provide inclination and gravity tool-face (TF), magnetometers, in conjunction with the accelerometers, help to obtain azimuth or direction of the well bore.

For measurement while drilling (MWD) applications, use of magnetometers is limited by external interferences such as from ferromagnetic interferences from drill string, ore deposits in bottom-hole assembly (BHA), and interaction of drilling fluids and debris with the earth's magnetic field. Such interferences influence the precision of magnetometers inducing azimuth estimation error. Hence, it is challenging to accurately measure azimuth while drilling.

In accordance with various aspects of the subject disclosure, systems and methods are provided for measuring azimuth using locally computed tool-face (TF) and magnetic field information provided by the survey grade magnetometers in the directional module (DM).

Figure 1A:
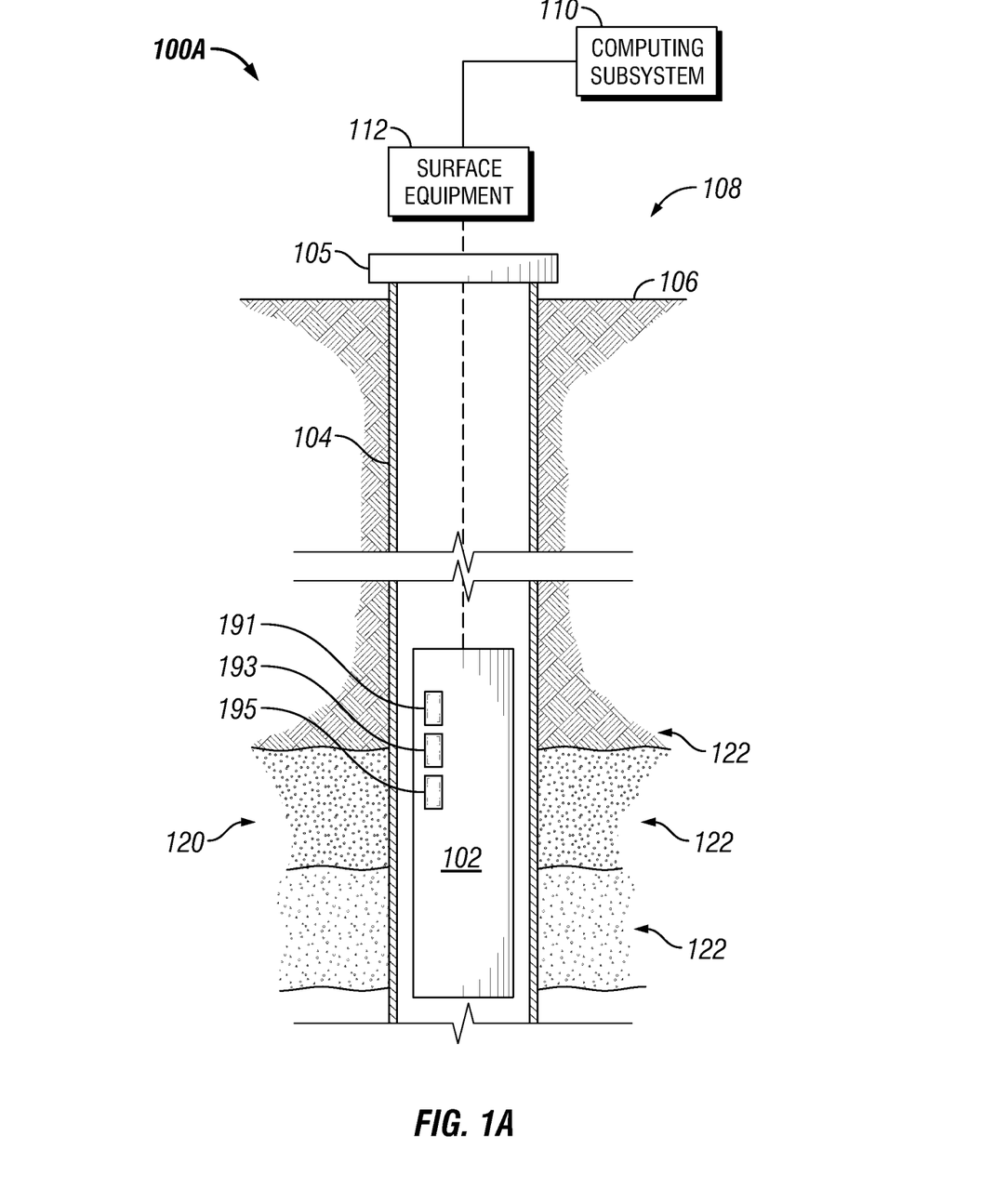
FIG. 1A is a diagram of an example well system, in accordance with aspects of the subject disclosure.

FIG. 1A is a diagram of an example well system 100a. Well system 100a includes measurement system 108 and a subterranean region 120 beneath the ground surface 106. A well system may include additional or different features that are not shown in FIG. 1A. For example, well system 100a may include additional drilling system components, wireline measurement system components, etc.

Subterranean region 120 may include all or part of one or more subterranean formations or zones. The example subterranean region 120 shown in FIG. 1A includes multiple subsurface layers 122 and a wellbore 104 penetrated through subsurface layers 122. Subsurface layers 122 may include sedimentary layers, rock layers, sand layers, or combinations of these and other types of subsurface layers. One or more of the subsurface layers may contain fluids, such as brine, oil, gas, etc. Although the example wellbore 104 shown in FIG. 1A is a vertical wellbore, measurement system 108 may be implemented in other wellbore orientations. For example, measurement system 108 may be adapted for horizontal wellbores, slanted wellbores, curved wellbores, vertical wellbores, or combinations of these.

The example measurement system 108 includes a measurement tool 102, surface equipment 112, and a computing subsystem 110. In the example shown in FIG. 1A, measurement tool 102 may be a downhole measurement tool that operates while disposed in wellbore 104. The example surface equipment 112 shown in FIG. 1A operates at or above surface 106, for example, near well head 105, to control measurement tool 102 and possibly other downhole equipment or other components of well system 100. The example computing subsystem 110 may receive and analyze measurement data from measurement tool 102. A measurement system may include additional or different features, and the features of a measurement system may be arranged and operated as represented in FIG. 1A or in another manner. In some instances, all or part of computing subsystem 110 may be implemented as a component of, or can be integrated with one or more components of, surface equipment 112, measurement tool 102 or both. In some cases, computing subsystem 110 may be implemented as one or more computing structures separate from surface equipment 112 and measurement tool 102.

In some implementations, computing subsystem 110 may be embedded in measurement tool 102, and computing subsystem 110 and measurement tool 102 may operate concurrently while disposed in wellbore 104. For example, although computing subsystem 110 is shown above surface 106 in the example shown in FIG. 1A, all or part of computing subsystem 110 may reside below surface 106, for example, at or near the location of the measurement tool 102.

Well system 100a can include communication or telemetry equipment that allows communication among computing subsystem 110, measurement tool 102, and other components of measurement system 108. For example, the components of measurement system 108 may each include one or more transceivers or similar apparatus for wired or wireless data communication among the various components. For example, measurement system 108 may include systems and apparatus for optical telemetry, wireline telemetry, wired pipe telemetry, mud pulse telemetry, acoustic telemetry, electromagnetic telemetry, or a combination of these and other types of telemetry. In some cases, measurement tool 102 receives commands, status signals, or other types of information from computing subsystem 110 or another source. In some cases, computing subsystem 110 receives measurement data, status signals, or other types of information from the measurement tool 102 or another source.

Measurement operations may be performed in connection with various types of downhole operations at various stages in the lifetime of a well system. Structural attributes and components of surface equipment 112 and measurement tool 102 may be adapted for various types of measurement operations. For example, measurement may be performed during drilling operations, during wireline measurement operations, or in other contexts. As such, surface equipment 112 and measurement tool 102 may include, or may operate in connection with drilling equipment, wireline measurement equipment, or other equipment for other types of operations.

Figure 1B:
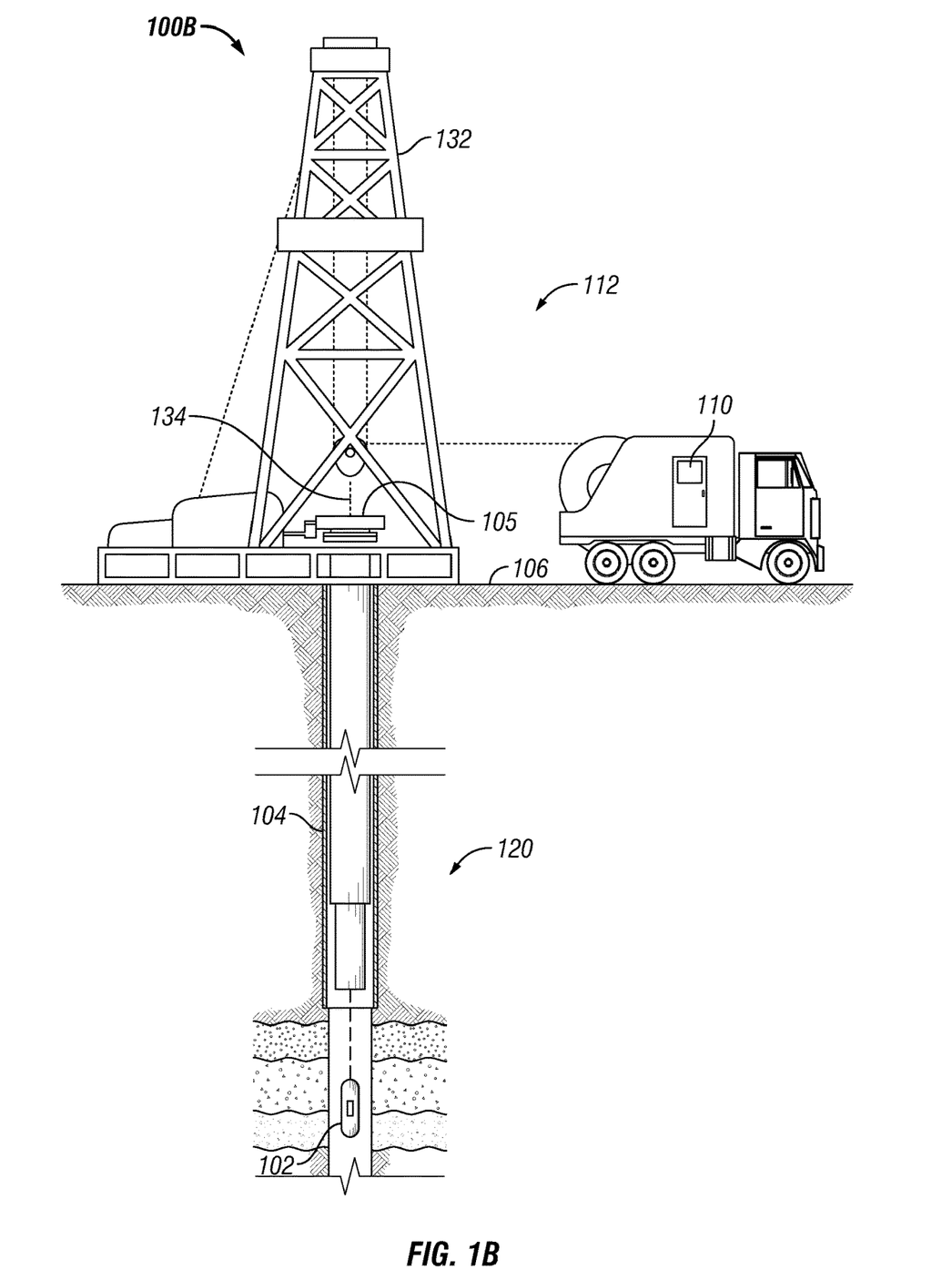
FIG. 1B is a diagram of an example well system that includes a measurement tool in a wireline measurement environment, in accordance with aspects of the subject disclosure.

In some examples, measurement operations may be performed during wireline measurement operations. FIG. 1B shows an example well system 100b that includes measurement tool 102 in a wireline measurement environment. In some example wireline measurement operations, surface equipment 112 includes a platform above surface 106 equipped with a derrick 132 that supports a wireline cable 134 that extends into wellbore 104. Wireline measurement operations may be performed, for example, after a drill string is removed from wellbore 104, to allow measurement tool 102 to be lowered by wireline or measurement cable into wellbore 104.

Figure 1C:
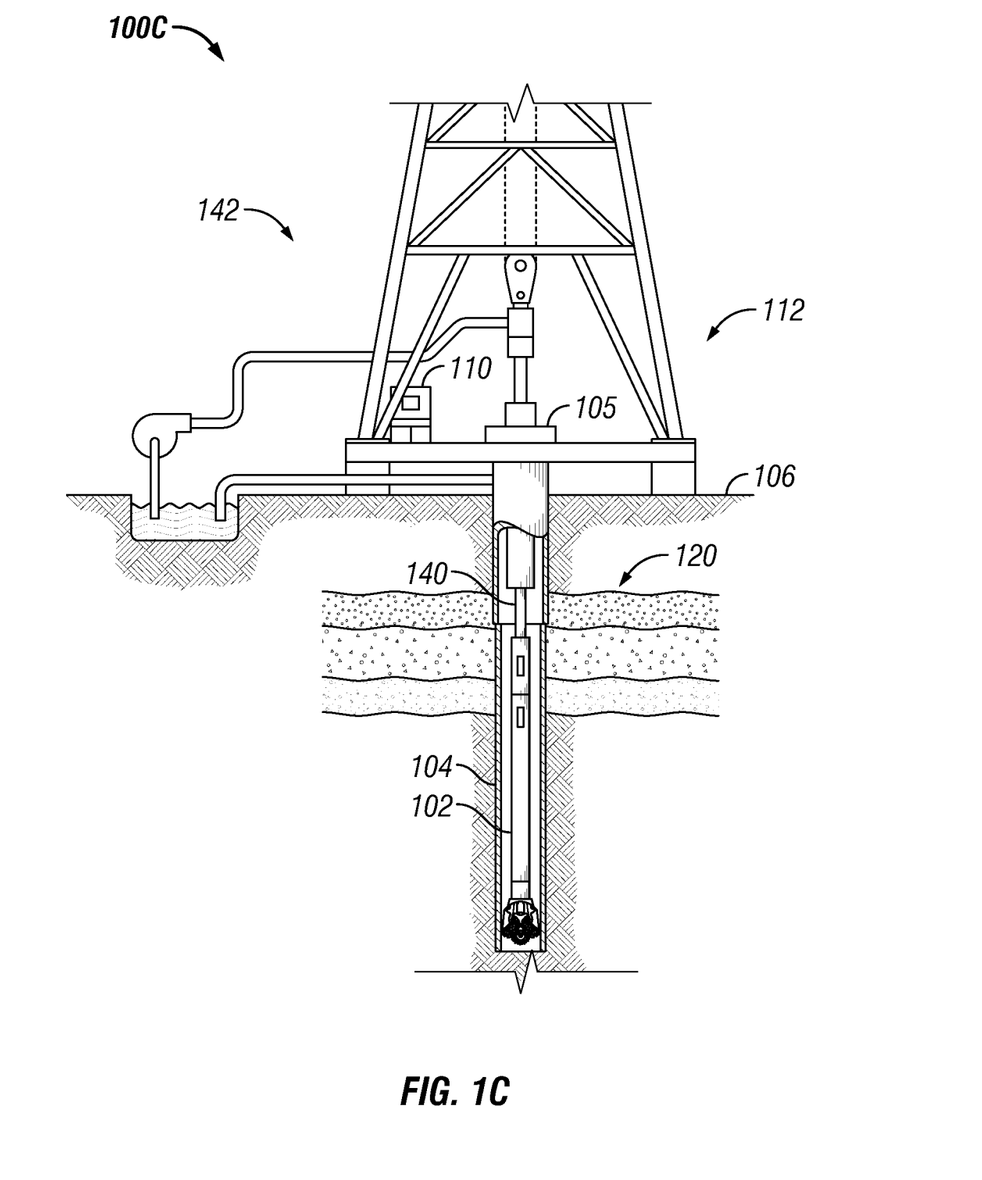
FIG. 1C is a diagram of an example well system that includes a measurement tool in a measurement while drilling (MWD) environment, in accordance with aspects of the subject disclosure.

In some examples, measurement operations may be performed during drilling operations. FIG. 1C shows an example well system 100c that includes measurement tool 102 in a measurement while drilling (MWD) environment. Drilling is commonly carried out using a string of drill pipes connected together to form a drill string 140 that is lowered through a rotary table into wellbore 104. In some cases, a drilling rig 142 at surface 106 supports drill string 140, as drill string 140 may operate to drill a wellbore penetrating subterranean region 120. Drill string 140 may include, for example, a kelly, drill pipe, a bottomhole assembly, and other components. The bottomhole assembly on the drill string may include drill collars, drill bits, measurement tool 102, and other components. The measurement tools may include measuring while drilling (MWD) tools, logging while drilling (LWD) tools, and others.

In some implementations, measurement tool 102 includes one or more accelerometers 191, magnetometers 193, angular sensors 195, and/or other sensors. A determination of the azimuth, φ, of wellbore 104 may be determined during a drilling operation based on data obtained by measurement tool 102 (e.g., by accelerometer 191 and/or magnetometer 193) during a survey operation, using the derivation provided as follows.

Let $G(n)=[g_x(n), g_y(n), g_z(n)]^T$ be the gravitational field vector obtained from local accelerometer 191 and $B(n)=[b_x(n), b_y(n), b_z(n)]^T$ be the magnetic field vectors obtained from the local magnetometer 193. During a stationary survey $Boxy=\sqrt{b_{xs}^2+b_{ys}^2}$, the magnetic dip angle y may be computed using DM.

In the long collar method, azimuth is computed as, $$\varphi(n) = \tan^{-1}\left\{\frac{-[b_x(n)\sin\alpha + b_y(n)\cos\alpha]}{[b_x(n)\cos\alpha - b_y(n)\sin\alpha]\cos\theta + b_z(n)\sin\theta}\right\} + decl, \quad (1)$$

where φ is the azimuth, α is the gravitational tool-face (GTF), decl is the magnetic declination and θ is the inclination. Defining $$\beta = \tan^{-1}\left(\frac{-b_y(n)}{b_x(n)}\right)$$

as the magnetic tool-face (MTF), we have:

$b_x(n)$=Boxy cos β, $b_y(n)$=Boxy sin β.

Substituting the above in Eq. (1) and simplifying, provides:

$$\varphi(n) = \tan^{-1}\left\{\frac{-\sin(\alpha+\beta)}{\cos(\alpha+\beta)\cos\theta + \frac{b_z(n)}{Boxy}\sin\theta}\right\} + decl. \quad (2)$$

However, in the presence of magnetic interferences, the computed MTF β and $b_z(n)$ may be erroneous. This may introduce error in Eq. (2). Accordingly, systems and methods disclosed herein obtain the azimuth, φ(n), without using the locally measured magnetic field parameters (e.g., locally measured during drilling operations).

In particular, it is known that:

$$\sin\gamma = \frac{G^T(n)B(n)}{G_T B_T}, \quad (3)$$

where $G_T=\sqrt{g_x(n)^2+g_y(n)^2+g_z(n)^2}$ and $B_T=\sqrt{b_x(n)^2+b_y(n)^2+b_z(n)^2}$ are the total gravitational and magnetic fields, respectively. Therefore, normalized $|\hat{b}_z(n)|$ may be estimated as:

$$|\hat{b}_z(n)|=\sqrt{1-Boxy^2} \quad (4)$$

Sign of $\hat{b}_z(n)$ may be positive or negative. In examples, an azimuth with both signs may be computed and the answer that may be the closest to a survey azimuth may be chosen. In another example, to solve the sign ambiguity may be to first compute:

$$\phi 1 = \frac{g_x(n)b(n) + g_y(n)b(yn) + g_z(n)b_z(n)}{G_T B_T} \quad (5)$$

$$\phi 2 = \frac{g_x(n)b(n) + g_y(n)b(yn) - g_z(n)b_z(n)}{G_T B_T} \quad (6)$$

In examples, if $|\sin y - \phi 1| < |\sin y - \phi 2|$, then sign of $\hat{b}_z(n)$ may be positive, else, negative.

Defining the normalized gravitational components:

$$g_x(n) = -\sin \theta \cos \alpha,$$

$$g_y(n) = \sin \theta \sin \alpha,$$

In examples, Eq. (3) may be written as:

$$\sin \gamma B_T = -\sin \theta \cos \alpha \, \text{Boxy} \cos \beta + \sin \theta \sin \alpha \, \text{Boxy} \sin \beta + b_z(n)g_z(n) \quad (7)$$

From Eq. (7), it may then be determined, for normalized magnetometer data, that $$\cos(\alpha + \beta) = \frac{\sin \gamma B_T - b_z(n)g_z(n)}{-\text{Boxy} \sin \theta} \quad (8)$$

and, $$\sin(\alpha + \beta) = \sin\{\cos^{-1}[\cos(\alpha + \beta)]\} \quad (9)$$

Substituting equations (4), (8), and (9) into equation (2), provides the azimuth, φ.

It may be noted that equation (8) may depend primarily on $g_z(n)$, the estimated $b_z(n)$, γ and the measured inclination θ. Hence azimuth estimation using the modified equation (2) does not depend on the local magnetic field vector. Since the inclination may be slowly changing, $g_z(n)$ averaged over N samples is used in the above equations in order to mitigate the random noise components.

The "Boxy" may be periodically updated using existing techniques during a survey and/or drilling operations. For example, a technique to update Boxy during a survey may include first computing the local Boxy as Boxy' and secondly computing the $$yRatio = \frac{Boxy}{Boxy'}.$$

In examples a technique to update Boxy during drilling operations may include first computing the local Boxy, Boxy'(n), for N samples, i.e., (n−N+1 to n) and secondly computing Boxy(n)=BoxyRatio*mean(Boxy').

Figure 2:
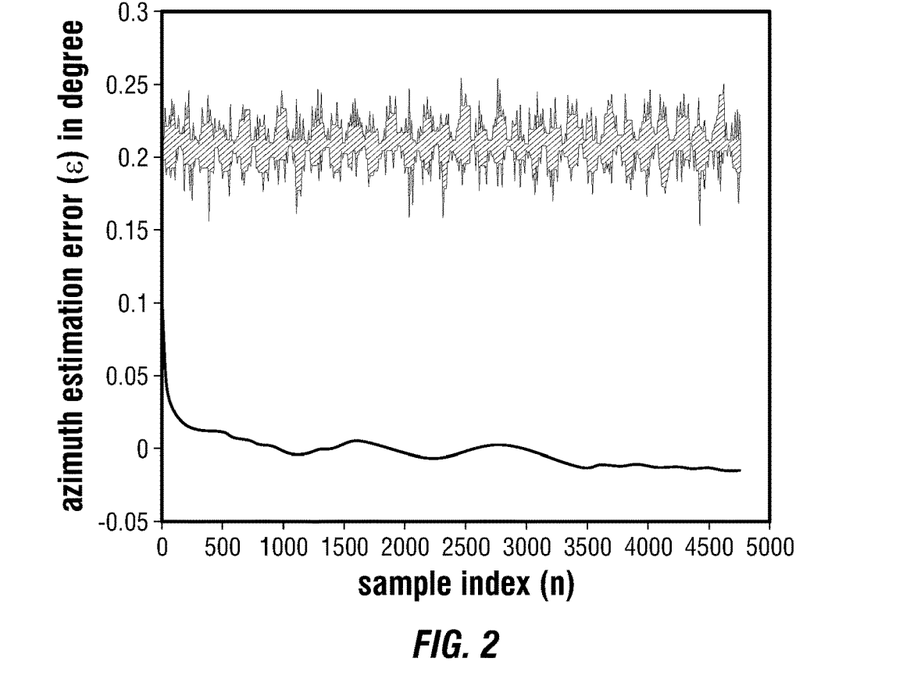
FIG. 2 is a graph of an azimuth estimation error in a noiseless environment.
Figure 3:
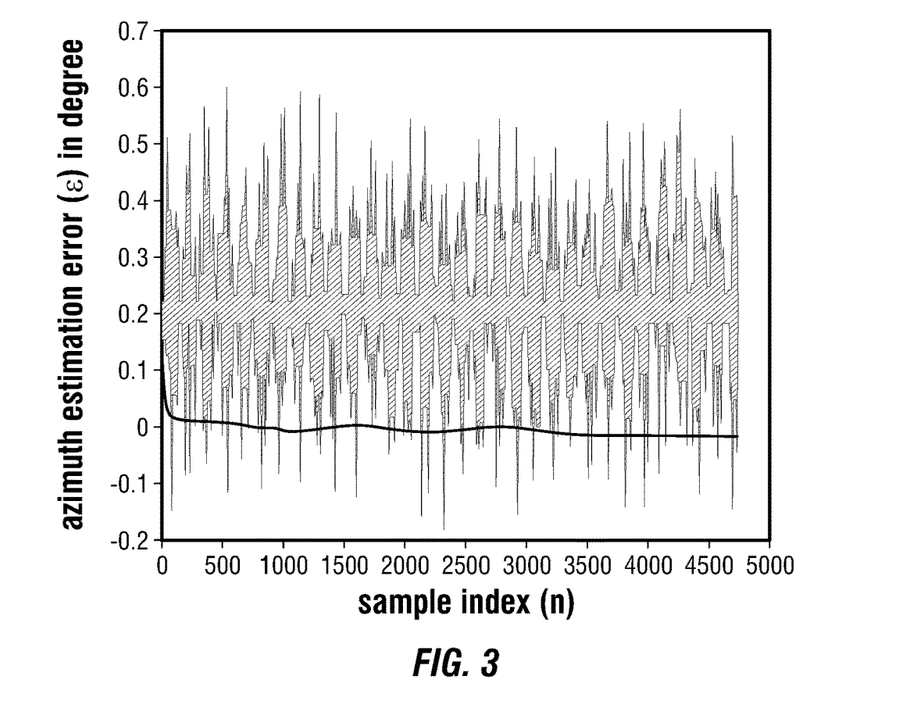
FIG. 3 is a graph of an azimuth estimation error in a noisy environment.
Figure 4:
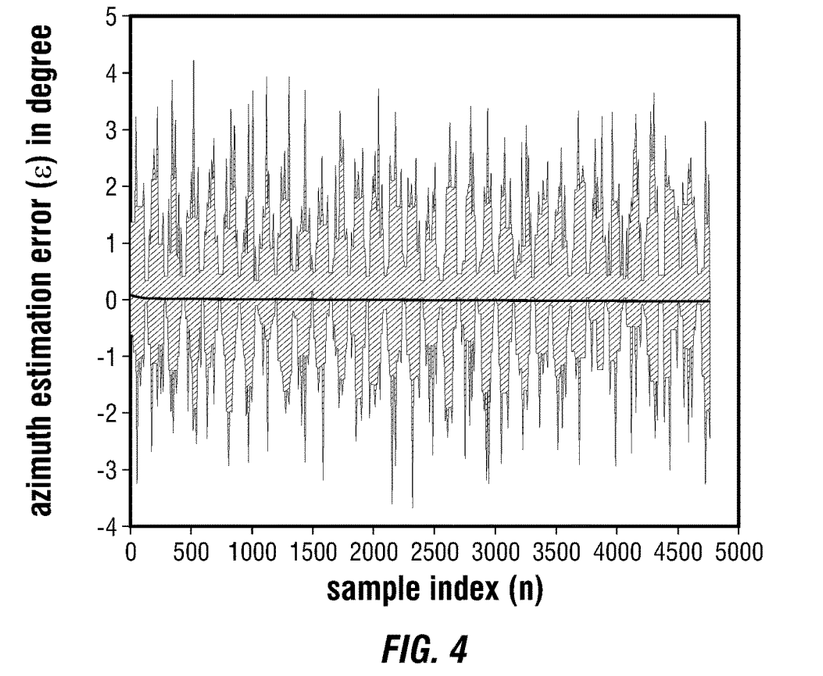
FIG. 4 is a graph of another azimuth estimation error in a noisy environment.
Figure 5:
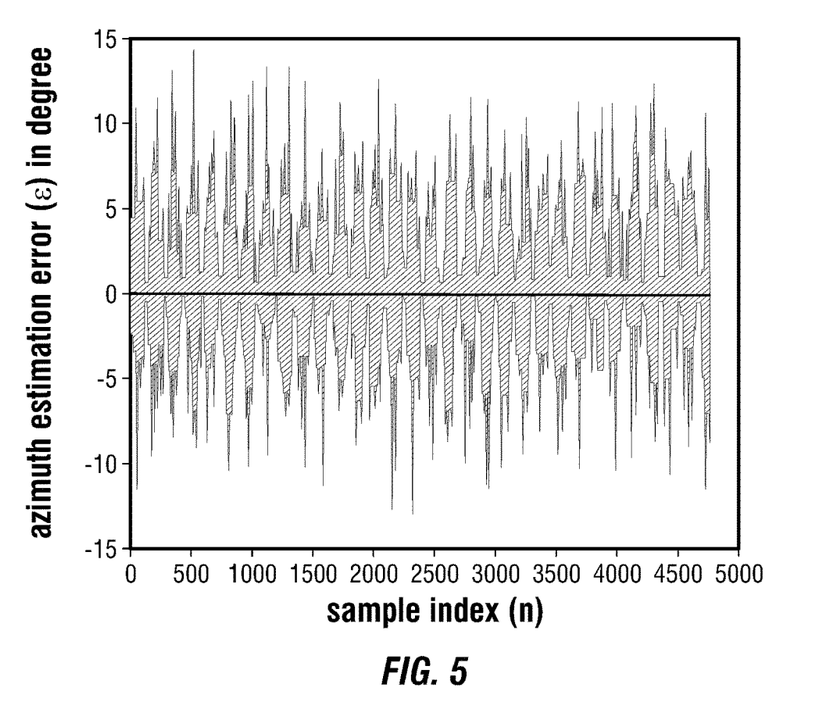
FIG. 5 is a graph of another azimuth estimation error in a noisy environment.
Figure 6:
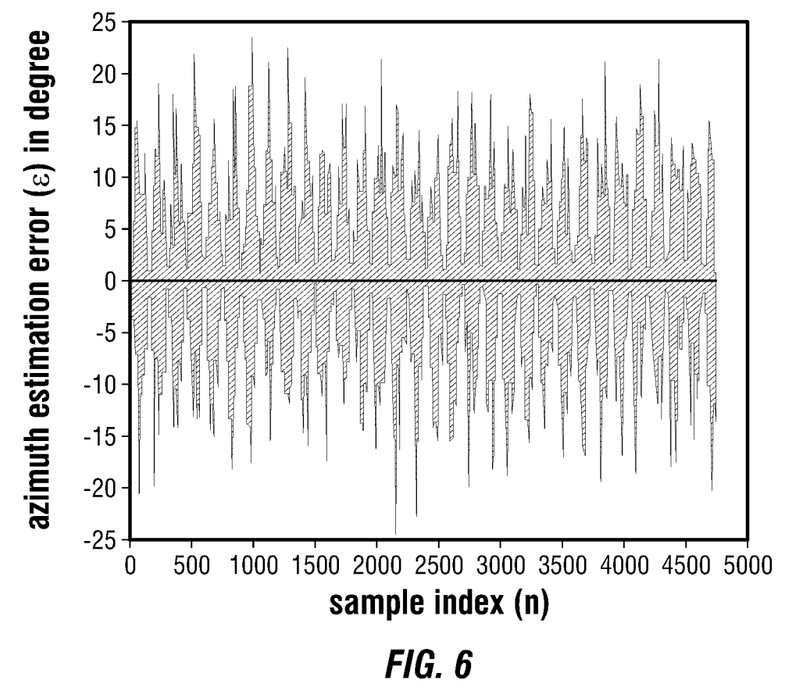
FIG. 6 is a graph of an another estimation error in a noisy environment.

FIGS. 2-6 are charts illustrating simulated results of the proposed method above with a conventional long collar method of computing azimuth. No GTF estimation error is assumed in the simulations shown. In FIG. 2, root-mean-square (RMS) estimation error $\epsilon_{RMS}$ obtained for magnetometer data with no external noise is shown. While the conventional algorithm achieves $\epsilon_{RMS}$=0.21°, the proposed method achieves $\epsilon_{RMS}$=0.01°. In order to examine the performance of the proposed algorithm, white Gaussian noise (WGN) with different signal-to-noise ratio (SNR) was added to the clean magnetometer data. FIGS. 3-6 show the results obtained for the noisy cases. The RMS error $\epsilon_{RMS}$ obtained in each case is tabulated in Table 1. Table 1 is RMS azimuth estimation error $\epsilon_{RMS}$ (in degree) compared to a signal to noise ratio. From the presented results, the proposed method outperforms the conventional method in estimating the azimuth angle.

TABLE 1

| | Clean | SNR = 40 dB | SNR = 20 dB | SNR = 10 dB | SNR = 5 dB |
|---|---|---|---|---|---|
| Proposed | 0.01 | 0.01 | 0.01 | 0.01 | 0.01 |
| Conventional | 0.21 | 0.23 | 0.97 | 3.02 | 5.4 |

From the presented results, it may be seen that the disclosed method outperforms the conventional method in estimating the azimuth angle.

Figure 7:
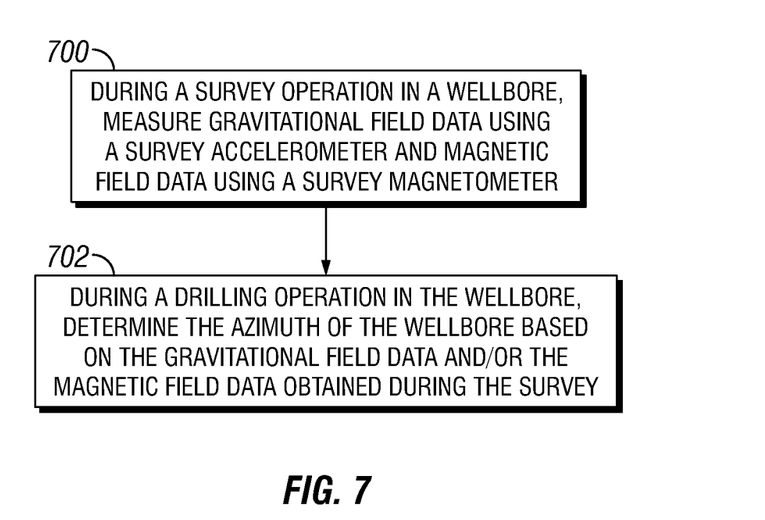
FIG. 7 is a flowchart of illustrative operations that may be performed for azimuth determination for a wellbore, in accordance with aspects of the subject disclosure.

FIG. 7 shows illustrative operations that may be performed (e.g., by measurement system 108) for azimuth determination (e.g., while drilling). At block 700, during a survey operation in a wellbore, gravitational field data (e.g., G(n)) may be obtained using a survey accelerometer and magnetic field data (e.g., B(n)) is obtained using a survey magnetometer. In examples "Boxy" may be determined from the obtained gravitational field data and magnetic field data as described above.

At block 702, during a drilling operation in the wellbore, the azimuth, φ, of the wellbore is determined based on the gravitational field data and/or the magnetic field data obtained during the survey (e.g., based on the determined Boxy with equations (6), (8), and (9) substituted into equation (2) above). For example, determining the azimuth based on the gravitational field data and/or the magnetic field data obtained during the survey may include estimating an axial (z) component of the magnetic field. Estimating the axial component of the magnetic field may include estimating the axial (z) component of the magnetic field based on a sine of a magnetic dip angle (γ) determined using a directional module (DM) during the survey. Estimating the axial component of the magnetic field may also include estimating the axial (z) component of the magnetic field based on an inverse (e.g., a Moore-Penrose pseudoinverse) of the gravitational field data obtained during the survey. Estimating the azimuth may include estimating the azimuth using the inclination measured during the survey and/or during drilling operations. In this way, the azimuth can be determined, during drilling operations, without obtaining or using magnetic field data during the drilling operations. In examples "Boxy" may be periodically updated as noted above.

In accordance with various aspects, systems and methods are provided that allow better estimation of azimuth in the presence of magnetic interferences, include azimuth determination independent of magnetic tool-face estimation, allow azimuth determination while drilling in the presence of magnetic interferences based on the gravitational tool-face and magnetic field information obtained during a stationary survey, and/or achieve better position control for rotary steerable systems (RSS) while drilling.

This method and system may include any of the various features of the compositions, methods, and system disclosed herein, including one or more of the following statements.

Statement 1. A method may comprise measuring during a survey operation a gravitational field data using a survey accelerometer and magnetic field data using a survey magnetometer, and determining during a drilling operation an azimuth of a wellbore based on the gravitational field data and the magnetic field data obtained during the survey operation.

Statement 2. The method of statement claim 1, wherein determining the azimuth comprises estimating an axial component of a magnetic field in the wellbore.

Statement 3. The method of statements 1 or 2, wherein estimating the axial component of the magnetic field comprises estimating the axial component of the magnetic field based on a magnetic dip angle determined during the survey operation.

Statement 4. The method of statements 1 to 3, wherein estimating the axial component of the magnetic field further comprises estimating the axial (z) component of the magnetic field based on an inverse of the gravitational field data obtained during the survey operation.

Statement 5. The method of statement 4, wherein the inverse is a Moore-Penrose pseudoinverse.

Statement 6. The method of statements 1 to 3, wherein estimating the azimuth comprises estimating the azimuth determining an inclination of the wellbore based on the gravitational field data measured during the survey operation or additional gravitational field data measured during the drilling operation.

Statement 7. The method of statements 1 to 3 or 6, wherein determining the azimuth during the drilling operation, comprises determining the azimuth during the drilling operation without obtaining magnetic field data during the drilling operation.

Statement 8. The method of statements 1 to 3, 6, or 7, further comprising computing $Boxy=\sqrt{b_{xs}^2+b_{ys}^2}$ during the survey operation or the drilling operation, wherein $b_{xs}$ is a magnetic field vector in a x direction and $b_{ys}$ is a magnetic field vector in a y direction.

Statement 9. The method of statements 1 to 3 or 6 to 8, further comprising updating Boxy during the survey operation by computing $$Boxy' \text{ and } BoxyRatio = \frac{Boxy}{Boxy'}.$$

Statement 10. The method of statements 1 to 3 or 6 to 9, further comprising updating Boxy during the drilling operation by computing Boxy'(n), for N samples, i.e., (n−N+1 to n) and computing Boxy(n)=BoxyRatio*mean(Boxy').

Statement 11. A system may comprise a drilling rig; a pipe string attached to the drilling rig; a bottom hole assembly attached to the pipe string, wherein the bottom hole assembly comprises at least one sensor; a drill bit, wherein the at least one sensor measure a revolutions-per-minute (RPM) of the drill bit; and a computing subsystem connected to the at least one sensor and configured to: measure a gravitational field data using a survey accelerometer and magnetic field data using a survey magnetometer; and determine an azimuth of a wellbore based on the gravitational field data and the magnetic field data.

Statement 12. The system of statement 11, wherein the computing sub system is further configured to estimate an axial component of a magnetic field in the wellbore.

Statement 13. The system of statements 11 or 12, wherein the computing sub system is further configured to estimate the axial component of the magnetic field based on a magnetic dip angle.

Statement 14. The system of statements 11 to 13, wherein the computing sub system is further configured to estimate the axial (z) component of the magnetic field based on an inverse of the gravitational field data.

Statement 15. The system of statements 11 to 14, wherein the inverse is a Moore-Penrose pseudoinverse.

Statement 16. The system of statements 11 to 15, wherein the computing sub system is further configured to estimate the azimuth determining an inclination of the wellbore based on the gravitational field data.

Statement 17. The system of statements 11 to 16, wherein the computing sub system is further configured to determine the azimuth during the drilling operation without obtaining magnetic field data.

Statement 18. The system of statements 11 to 17, wherein the computing sub system is further configured to compute $Boxy=\sqrt{b_{xs}^2+b_{ys}^2}$, wherein $b_{xs}$ is a magnetic field vector in a x direction and $b_{ys}$ is a magnetic field vector in a y direction.

Statement 19. The system of statement 18, wherein the computing sub system is further configured to update Boxy by computing $$Boxy' \text{ and } BoxyRatio = \frac{Boxy}{Boxy'}.$$

Statement 20. The system of statement 18, wherein the computing sub system is further configured to update Boxy by computing Boxy'(n), for N samples, i.e., (n−N+1 to n) and computing Boxy(n)=BoxyRatio*mean(Boxy').

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Unless otherwise specified, terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A method, comprising:
   measuring during a survey operation a gravitational field data using a survey accelerometer and magnetic field data using a survey magnetometer; and
   determining during a drilling operation, wherein the drilling operation includes using a drill bit and at least one sensor deployed on a bottom hole assembly, an azimuth of a wellbore based on the gravitational field data and the magnetic field data obtained during the survey operation, wherein determining the azimuth of the wellbore is independent of a magnetic tool-face estimation.

2. The method of claim 1, wherein determining the azimuth comprises estimating an axial component of a magnetic field in the wellbore.

3. The method of claim 2, wherein estimating the axial component of the magnetic field comprises estimating the axial component of the magnetic field based on a magnetic dip angle determined during the survey operation.

4. The method of claim 3, wherein estimating the axial component of the magnetic field further comprises estimating the axial (z) component of the magnetic field based on an inverse of the gravitational field data obtained during the survey operation.

5. The method of claim 4, wherein the inverse is a Moore-Penrose pseudoinverse.

6. The method of claim 1, wherein estimating the azimuth comprises estimating the azimuth determining an inclination of the wellbore based on the gravitational field data measured during the survey operation or additional gravitational field data measured during the drilling operation.

7. The method of claim 1, wherein determining the azimuth during the drilling operation, comprises determining the azimuth during the drilling operation without obtaining magnetic field data during the drilling operation.

8. The method of claim 1, further comprising computing $Boxy=\sqrt{b_{xs}^2+b_{ys}^2}$ during the survey operation or the drilling operation, wherein $b_{xs}$ is a magnetic field vector in a x direction and $b_{ys}$ is a magnetic field vector in a y direction.

9. The method of claim 8, further comprising updating the Boxy during the survey operation by computing $$Boxy' \text{ and } BoxyRatio = \frac{Boxy}{Boxy'}.$$

10. The method of claim 8, further comprising updating the Boxy during the drilling operation by computing Boxy'(n), for N samples, i.e., (n−N+1 to n) and computing Boxy(n)=BoxyRatio*mean(Boxy').

11. A system comprising:
a drilling rig;
a pipe string attached to the drilling rig;
a bottom hole assembly attached to the pipe string, wherein the bottom hole assembly comprises at least one sensor;
a drill bit, wherein the at least one sensor measure a revolutions-per-minute (RPM) of the drill bit; and
a computing subsystem connected to the at least one sensor for:
measuring a gravitational field data using a survey accelerometer and magnetic field data using a survey magnetometer; and
determining an azimuth of a wellbore based on the gravitational field data and the magnetic field data, wherein the determines the azimuth of a wellbore is independent of a magnetic tool-face estimation.

12. The system of claim 11, wherein the computing sub system further estimates an axial component of a magnetic field in the wellbore.

13. The system of claim 12, wherein the computing sub system further estimates the axial component of the magnetic field based on a magnetic dip angle.

14. The system of claim 13, wherein the computing sub system further estimates the axial (z) component of the magnetic field based on an inverse of the gravitational field data.

15. The system of claim 14, wherein the inverse is a Moore-Penrose pseudoinverse.

16. The system of claim 11, wherein the computing sub system further estimates the azimuth determining an inclination of the wellbore based on the gravitational field data.

17. The system of claim 11, wherein the computing sub system further determines the azimuth during the drilling operation without obtaining magnetic field data.

18. The system of claim 11, wherein the computing sub system further computes $Boxy = \sqrt{b_{xs}^2 + b_{ys}^2}$, wherein $b_{xs}$ is a magnetic field vector in a x direction and $b_{ys}$ is a magnetic field vector in a y direction.

19. The system of claim 18, wherein the computing sub system further updates the Boxy by computing $$Boxy' \text{ and } BoxyRatio = \frac{Boxy}{Boxy'}.$$

20. The system of claim 18, wherein the computing sub system further updates the Boxy by computing Boxy'(n), for N samples, i.e., (n−N+1 to n) and computing Boxy(n)=BoxyRatio*mean(Boxy').

* * * * *